United States Patent
Cho et al.

(10) Patent No.: US 7,829,415 B2
(45) Date of Patent: Nov. 9, 2010

(54) METHOD OF FABRICATING SEMICONDUCTOR DEVICE FOR PREVENTING A PILLAR PATTERN FROM BENDING AND FROM EXPOSING EXTERNALLY

(75) Inventors: Yun-Seok Cho, Icheon-si (KR); Young-Kyun Jung, Icheon-si (KR); Chun-Hee Lee, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 37 days.

(21) Appl. No.: 12/336,369

(22) Filed: Dec. 16, 2008

(65) Prior Publication Data
US 2009/0253236 A1 Oct. 8, 2009

(30) Foreign Application Priority Data
Apr. 4, 2008 (KR) ...................... 10-2008-0031469

(51) Int. Cl.
*H01L 21/336* (2006.01)
(52) U.S. Cl. ...................... 438/268; 438/282; 438/296; 257/328; 257/330; 257/E21.676; 257/E21.693
(58) Field of Classification Search .................. 438/268, 438/270, 282, 287, 284, 296, 430; 257/328, 257/330, 331, 332, E21.676, E21.693, E21.41, 257/E21.487, E21.325
See application file for complete search history.

(56) References Cited
U.S. PATENT DOCUMENTS

| | | | |
|---|---|---|---|
| 6,150,688 A | 11/2000 | Maeda et al. | |
| 6,798,009 B2 * | 9/2004 | Forbes et al. ................. | 257/301 |
| 7,190,042 B2 * | 3/2007 | Divakaruni et al. ......... | 257/510 |
| 2007/0075359 A1 * | 4/2007 | Yoon et al. ................... | 257/329 |
| 2007/0082448 A1 * | 4/2007 | Kim et al. .................... | 438/268 |
| 2008/0124867 A1 * | 5/2008 | Brown ......................... | 438/268 |

FOREIGN PATENT DOCUMENTS

| KR | 10-2005-0096169 | 12/2005 |
|---|---|---|
| KR | 100660881 | 12/2006 |
| KR | 10-2007-0038233 | 4/2007 |

OTHER PUBLICATIONS

KR Pub. 10-2009-0093399, Eun-Jeong Kim "The manufacturing method of the semiconductor device" (Sep. 2, 2009), Machine English Translation.*
Office Action dated Jan. 21, 2010, for Korean application No. 10-2008-0031469, citing the above references.

* cited by examiner

*Primary Examiner*—Khiem D Nguyen
(74) *Attorney, Agent, or Firm*—Lowe Hauptman Ham & Berner LLP

(57) ABSTRACT

A method of fabricating a semiconductor device includes forming a plurality of pillar patterns on a substrate, filling a gap between the pillar patterns with a first conductive layer, forming a first hard mask layer pattern over the pillar patterns adjacent in one direction, etching the first conductive layer using the first hard mask layer pattern as an etch barrier, forming a second hard mask pattern over the pillar pattern adjacent in the other direction that crosses the one direction, and forming a gate electrode surrounding the pillar patterns by etching the first conductive layer etched using the second hard mask layer pattern as an etch barrier.

15 Claims, 12 Drawing Sheets

I-I'

I-I'

II-II'

I-I'

METHOD OF FABRICATING SEMICONDUCTOR DEVICE FOR PREVENTING A PILLAR PATTERN FROM BENDING AND FROM EXPOSING EXTERNALLY

CROSS-REFERENCE TO RELATED APPLICATIONS

The present application claims priority of Korean patent application number 10-2008-0031469, filed on Apr. 4, 2008, the content of which is incorporated by reference in its entirety.

BACKGROUND

The disclosure relates to a method of fabricating a semiconductor device, and more particularly, to a method of fabricating a semiconductor device having a vertical channel arrangement.

The area available for a unit memory cell has decreased with the increased demand for semiconductor memory capacity/density. Due to this decrement of the unit memory cell area, a semiconductor device having a vertical channel has been introduced. That is, the semiconductor device includes a vertical channel arrangement by arranging a source and a drain in a vertical direction in an active area.

FIGS. 1A to 1C are cross-sectional views of a semiconductor device which depict a method of fabricating a semiconductor device having a channel formed in a vertical direction according to the related art.

As shown in FIG. 1A, a plurality of gate hard mask layer patterns 12 are formed on a substrate 11. Pillar heads 13 are formed by etching the substrate using the plurality of gate hard mask layer patterns 12 as an etch barrier.

Then, spacers 14 are formed on sidewalls of the gate hard mask patterns 12 and the pillar heads 13, and pillar necks 15 are formed by etching the substrate 11 using the spacers 14 as the etch barrier. Hereinafter, the pillar head 13 and the pillar neck 15 are referred together as a pillar pattern.

Then, a gate insulation layer 16 and a gate electrode 17 are formed to surround the pillar neck 15. That is, the gate electrode 17 is formed by depositing a conductive layer and performing an etch-back process without an additional mask.

As shown in FIG. 1B, impurities are doped on the substrate 11, and hard mask layer patterns 18 are formed to cover each of the pillar patterns. Here, an oxide layer is formed as the hard mask layer patterns 18.

Then, a trench 22 is formed in the impurity doped substrate 11 using the hard mask layer patterns 18 as an etch barrier, thereby forming a buried bit line 19 by isolating the impurity region.

After forming the buried bit line 19, the hard mask layer patterns 18 are removed.

As shown in FIG. 1C, an isolation layer 20 is formed for insulation between the adjacent buried bit lines 19 and between the buried bit line 19 and a word line. Then, a word line 21 is formed for connecting the gate electrodes 17.

By forming the word line 21, the fabrication of the semiconductor device having a vertical channel arrangement is completed.

However, the fabricated semiconductor device according to the related art tends to suffer from following problems.

At first, it is required to form the gate hard mask layer pattern 12 to be relatively thick, for example, about 1500 to 2000 Å, because a great portion of the gate hard mask layer pattern 12 is lost in the etch-back process of forming the gate electrode 17. Therefore, the pillar pattern may become bent because a relatively large weight is applied to the pillar neck 15, which is relatively narrow, while forming the pillar neck 15 as shown in FIG. 1A.

Secondly, it becomes harder to isolate the impurity region as a space between pillar patterns gets smaller. That is, the pillar pattern may be exposed because a portion of the spacer 14 is lost while forming the trench 22 as shown in FIG. 1B. This is caused because the etch selectivity of the hard mask layer pattern 18 is not suited to an etchant gas used for etching the substrate 11. That is to say, while etching the substrate 11, the hard mask layer pattern 18 and the sidewall passivation layer 14, which are formed of an oxide layer, are excessively removed while etching the substrate 11.

Thirdly, the word line 21 may be shorted by the pillar pattern as shown in FIG. 2 which is a plan view of FIG. 1C. Here, the adjacent word lines 21 are connected through the gate electrode. Since a width W10 of the gate electrode 17 is small, the resistance of the word line 21 increases. In general, resistance is in inverse proportion to an area.

Therefore, it has been required to develop a new technology which can overcome the fabrication problems associated with the semiconductor device having the vertical channel according to the related art.

SUMMARY

Embodiments of the present application are directed to providing a method of fabricating a semiconductor device for preventing a pillar pattern from bending and from exposing externally.

In accordance with an aspect of the present application, there is provided a method of fabricating a semiconductor device including forming a plurality of pillar patterns on a substrate, filling a gap between the pillar patterns with a first conductive layer, forming a first hard mask layer pattern over the pillar patterns adjacent in one direction, etching the first conductive layer using the first hard mask layer pattern as an etch barrier, forming a second hard mask pattern over the pillar pattern adjacent in the other direction that crosses the one direction, and forming a gate electrode surrounding the pillar patterns by etching the first conductive layer etched using the second hard mask layer pattern as an etch barrier.

In accordance with an aspect of the present application, there is provided a method of fabricating a semiconductor device including forming a plurality of pillar patterns on a substrate, forming an impurity region by doping impurity into the substrate at a base of the pillar pattern, forming a gate insulation layer so as to surround a pillar neck of each of the pillars, forming a first conductive layer over the gate insulation layer, forming a first mask layer pattern over the first conductive layer so that the width of the first mask layer pattern is wider than a width of the pillar pattern including a sidewall passivation layer and so that the first mask pattern extends in one direction as a line type mask pattern for forming a buried bit line by dividing the impurity region by about half, forming a first a first trench by etching the first conductive layer, the gate insulation layer, and a portion of the impurity region using the first mask layer pattern as an etch barrier, removing the first mask layer pattern, filling the first trench with a first insulation layer, forming a second mask layer pattern over the first insulation layer so that the second mask layer pattern extends in a direction crossing the removed first mask layer pattern, and forming a second trench by etching the first conductive layer pattern using the second mask pattern as an etch barrier, thereby forming a first conductive layer pattern that surrounds pillar patterns individually.

BRIEF DESCRIPTION OF THE DRAWINGS

Various embodiments are illustrated by way of example, and not by limitation, in the figures of the accompanying drawings.

DESCRIPTION OF EXEMPLARY EMBODIMENTS

Other aspects and advantages of the disclosed embodiments will become understood from the following description of the embodiments of the present application.

FIGS. 3A to 12B describe a method for fabricating a semiconductor device having a vertical channel arrangement in accordance with an embodiment of the present application. FIGS. 3A, 4A, 5A, 6A, 7A, 8A, 9A, 10A, 11A, and 12A are plan views of a semiconductor device in accordance with an embodiment of the present application, and FIGS. 3B, 4B, 5B, 6B, 7B, 8B, 9B, 10B, 11B, and 12B are cross-sectional views of FIGS. 3A, 4A, 5A, 6A, 7A, 8A, 9A, 10A, 11A, and 12A taken along the line I-I', respectively. FIGS. 6C, 7C, 8C, 9C, and 10C are cross-sectional views of FIGS. 6A, 7A, 8A, 9A, and 10A taken along the line II-II', respectively.

Figure 3A:
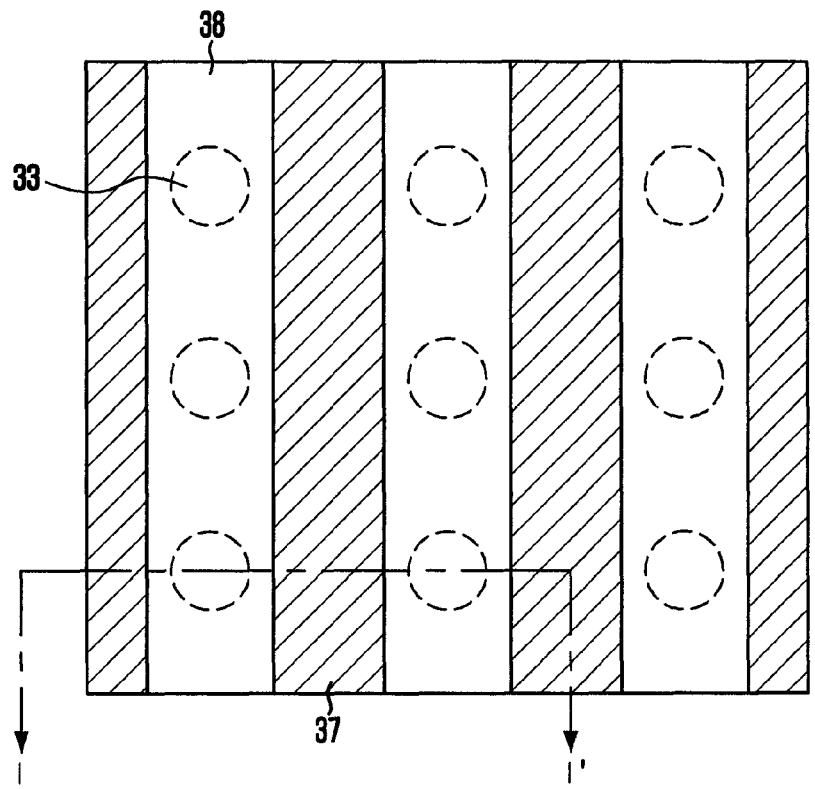
FIGS. 3A to 12B are diagrams depicting a method for fabricating a semiconductor device having a channel formed in a vertical direction in accordance with an embodiment of the present application.
Figure 3B:
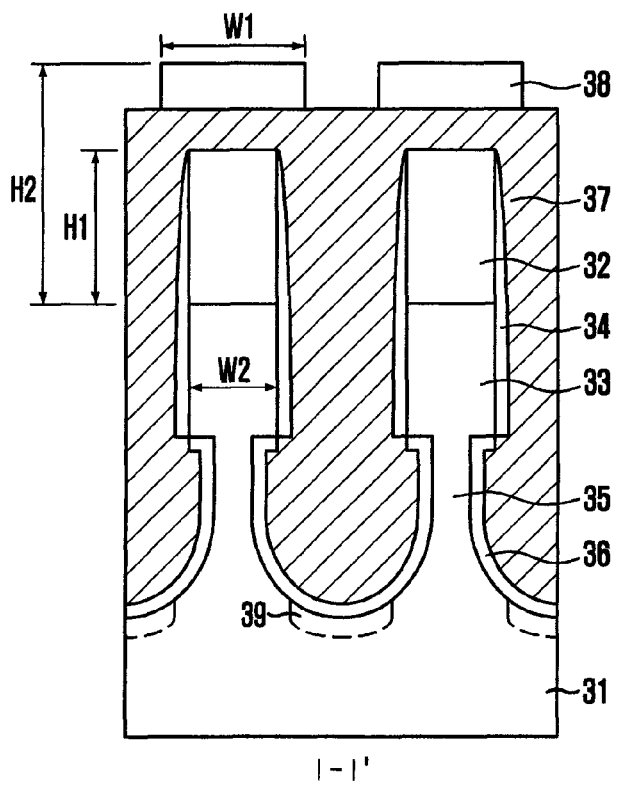

As shown in FIGS. 3A and 3B, a plurality of gate hard mask layer patterns 32 are formed over the substrate 31, and pillar heads 33 are formed by etching the substrate 31 using the plurality of the gate hard mask layer patterns 32 as the etch barrier.

The plurality of gate hard mask layer patterns 32 are formed of a nitride layer, particularly, a silicon nitride layer. The gate hard disk layer patterns 32 are formed at a thickness H1 of about 1000 to 1400 Å, which is thinner than a thickness H2 of the related art.

A sidewall passivation layer 34 is formed over sidewalls of the gate hard mask layer pattern 32 and the pillar head 33. Then, pillar necks 35 are formed by isotropically etching the substrate 31 using the sidewall passivation layer 34 as an etch barrier.

The sidewall passivation layer 34 is formed by depositing a nitride layer over the substrate having the pillar head 33 and performing an etch-back process.

Hereinafter, the pillar head 33 and the pillar neck 35 are referred together as a pillar pattern.

An impurity region 39 is formed by doping impurity on the substrate 31 under the pillar pattern. The impurity region 39 operates as source and drain as well as a buried bit line. When the impurity region 39 is formed, source and drain are formed in the pillar head 33.

Then, the gate insulation layer 36 is formed to surround the pillar neck 35, and a first conductive layer 37 is formed over the substrate having the gate insulation layer 36. Here, a gap between the pillar patterns is formed with the first conductive layer 37. The first conductive layer 37 may be a poly silicon layer or a metal layer.

Then, a first mask layer pattern 38 is formed over the first conductive layer 37.

The width W1 of the first mask layer pattern 38 is wider than a width W2 of the pillar pattern. Also, the width W1 is wider than that of the pillar pattern with the sidewall passivation layer 34. The first mask pattern 38 extends in one direction as a line type mask pattern for forming a buried bit line by dividing the impurity region 39 by half.

Figure 4A:
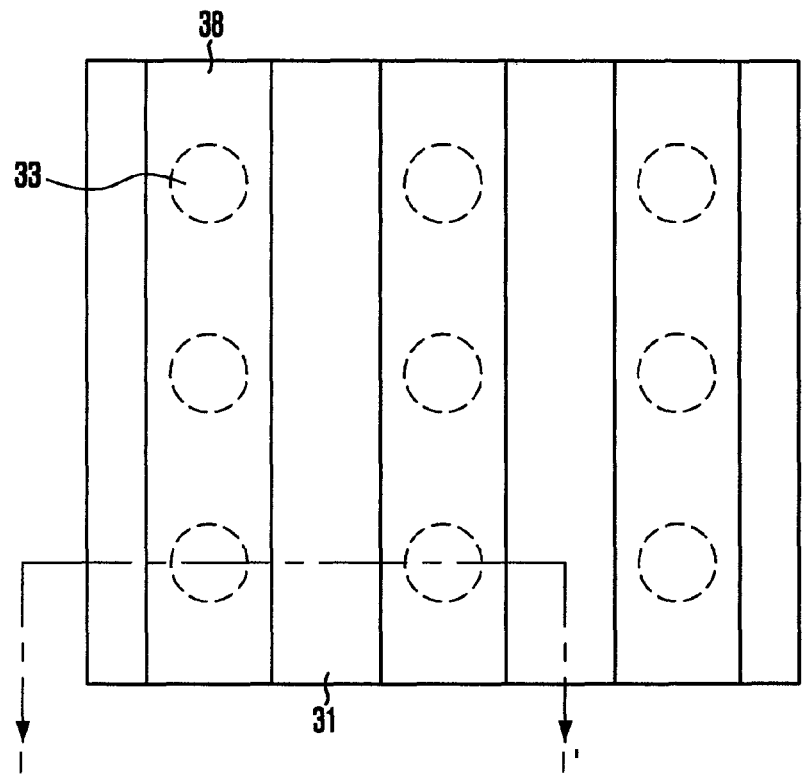
Figure 4B:
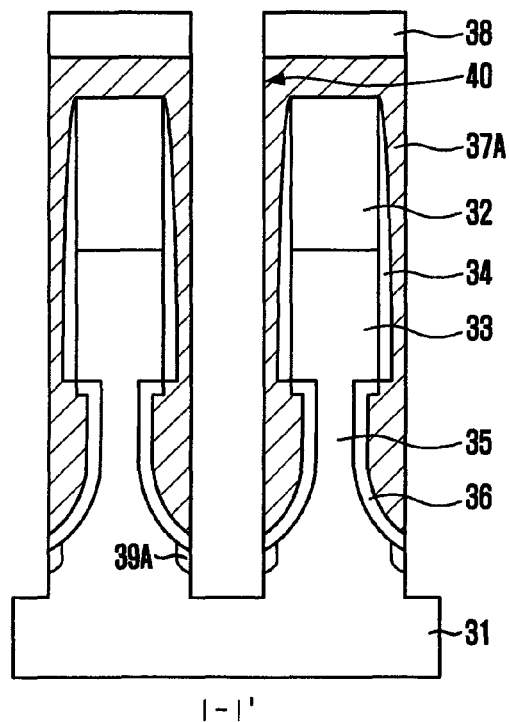

FIG. 4A is a plan view, and FIG. 4B is a cross-sectional view of FIG. 4A taken along the line I-I'. As shown in FIGS. 4A and 4B, a first trench 40 is formed by etching a first conductive layer 37, a gate insulation layer 36, and an impurity region 39 of the substrate 31 using the first mask layer pattern 38 as an etch barrier. Here, the impurity region 39 is divided into two regions by the etch process, thereby forming a plurality of buried bit lines 39A that connect the pillar patterns. Hereafter, the etched first conductive layer 37 is referred as the first conductive layer pattern 37A.

Then, the first mask layer pattern 38 is removed.

Figure 5A:
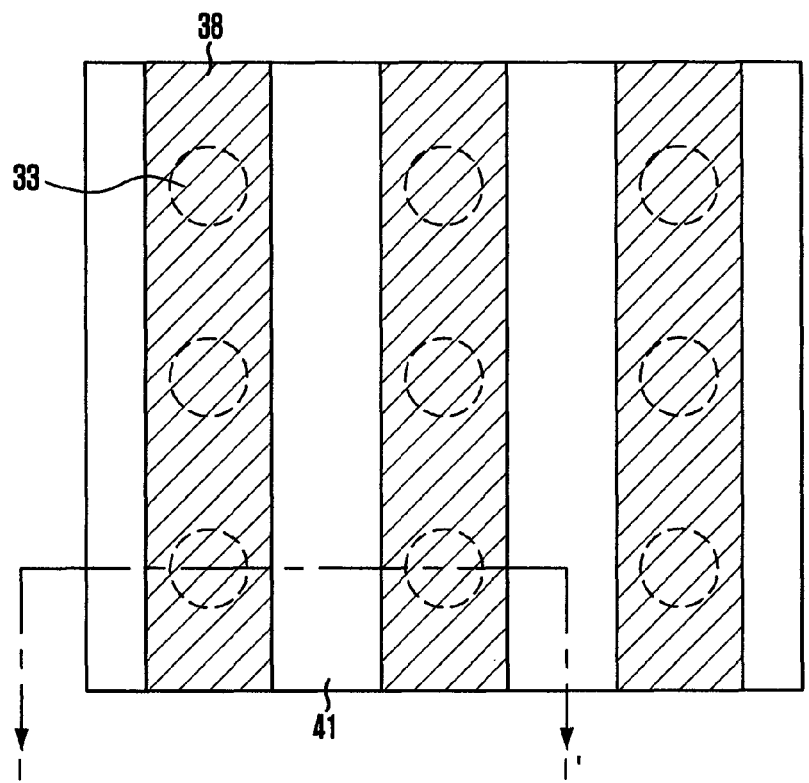
Figure 5B:
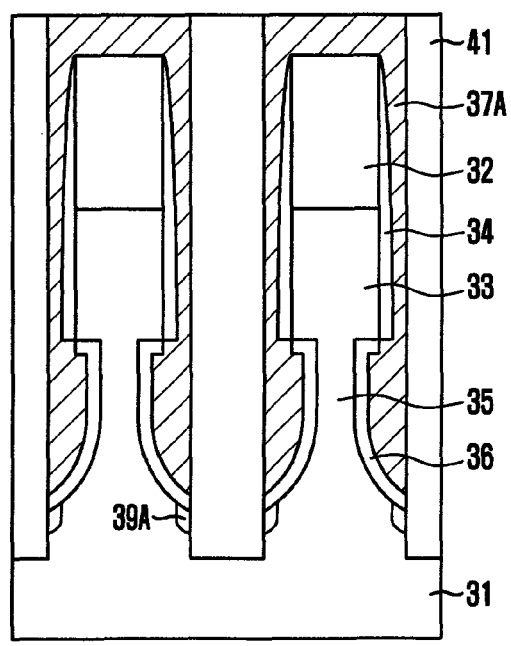

FIG. 5A is a plan view and FIG. 5B is a cross-sectional view of FIG. 5A taken along the line I-I'. As shown in FIGS. 5A and 5B, a first insulation layer 41 is formed. The first insulation layer 41 fills in the first trench 40. The first insulation layer 41 may be an oxide layer or a spin on insulation layer.

Figure 6A:
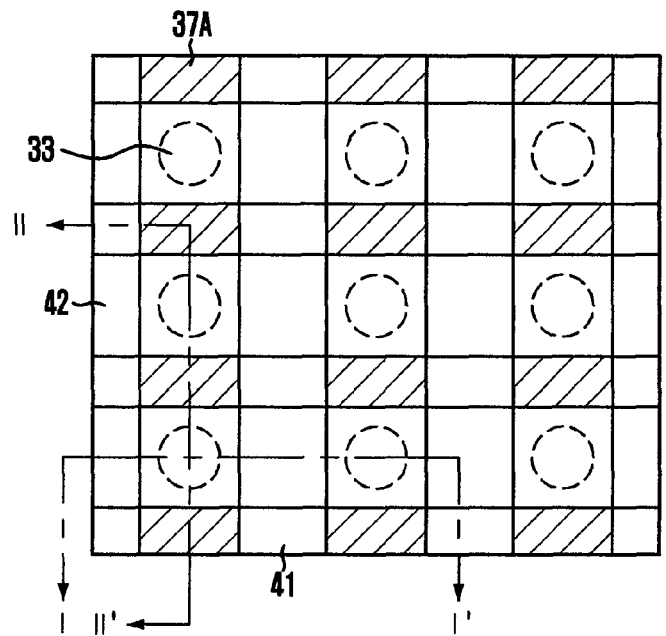
Figure 6B:
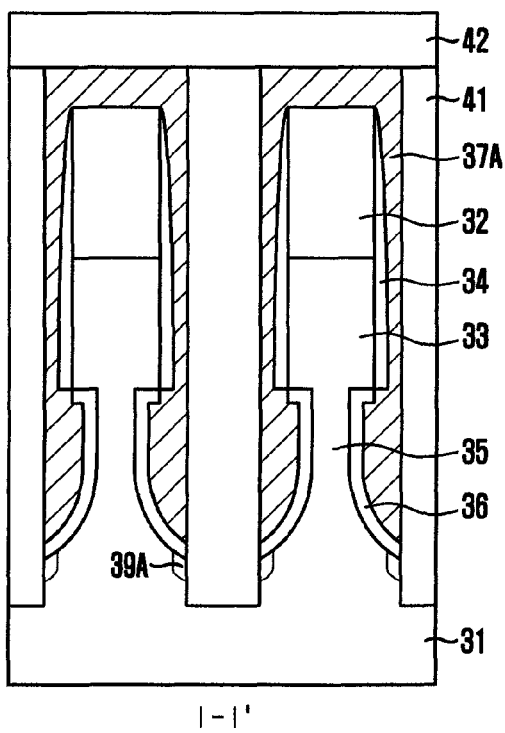
Figure 6C:
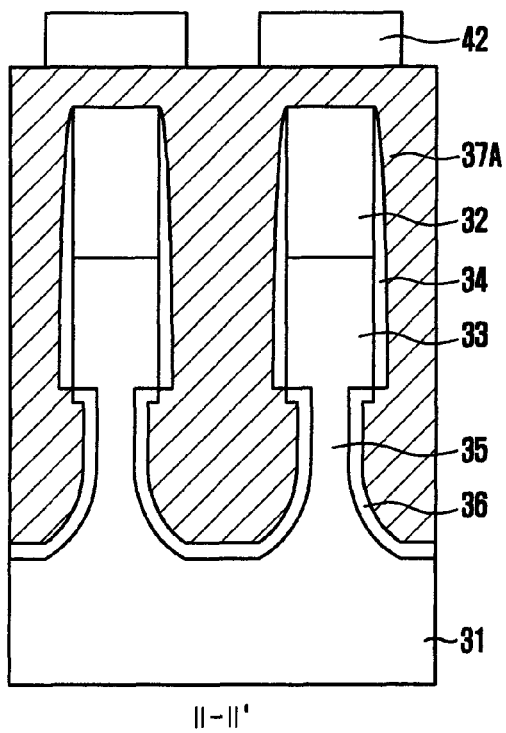

FIG. 6A is a plan view, FIG. 6B is a cross-sectional view of FIG. 6A taken along the line I-I", and FIG. 6C is a cross-sectional view of FIG. 6A taken along the line II-II'. As shown in FIGS. 6A to 6C, a second mask layer pattern 42 is formed over the substrate 31 having the first insulation layer 41. The second mask layer pattern 42 extends in a direction crossing the removed first mask layer pattern (see 38 of FIG. 3B). The second mask layer pattern 42 is a line type mask pattern.

Figure 7A:
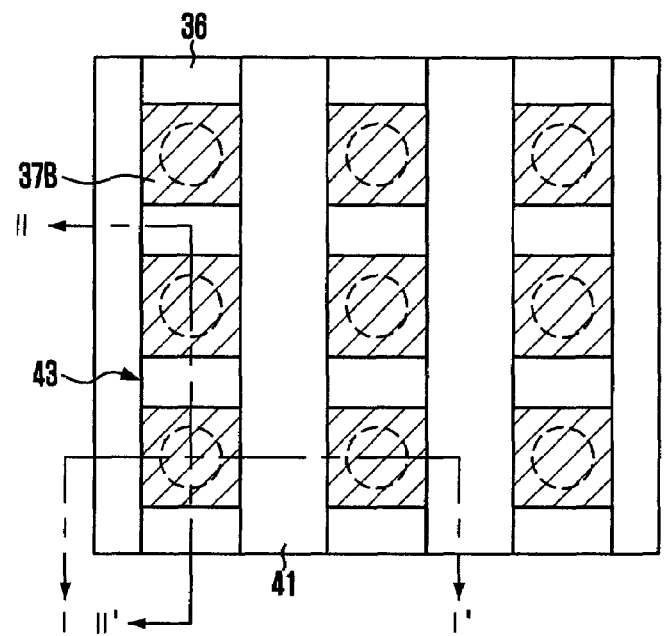
Figures 7B, 7C:
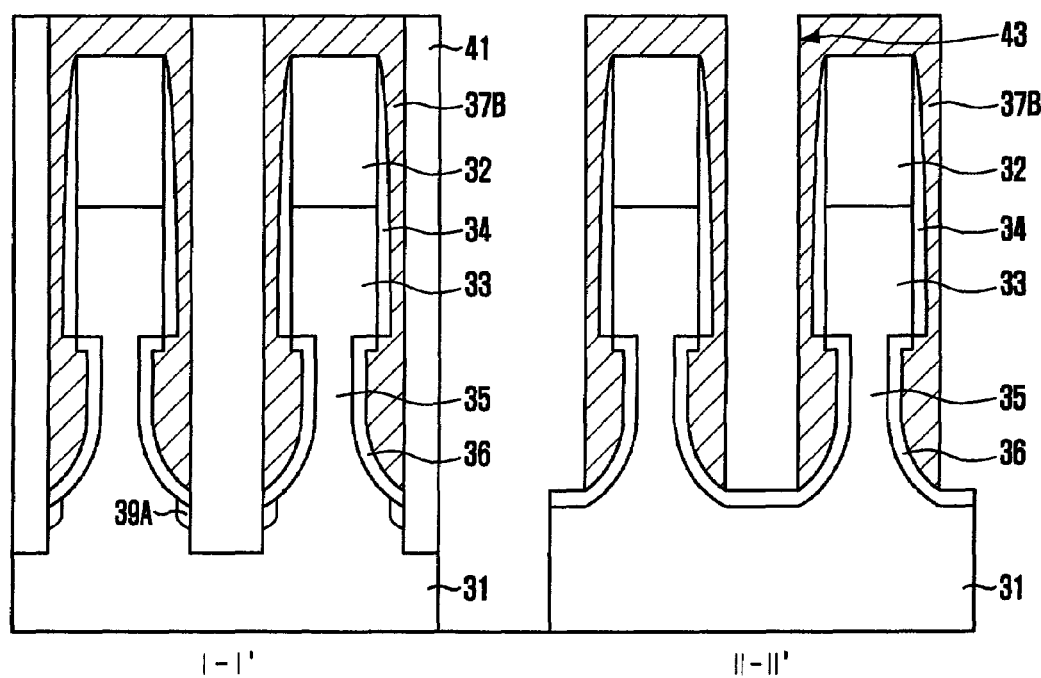

FIG. 7A is a plan view, FIG. 7B is a cross-sectional view of FIG. 7A taken along the line I-I', and FIG. 7C is a cross-sectional view of FIG. 7A taken along the line II-II'. As shown in FIGS. 7A to 7C, a second trench 43 is formed by etching the first conductive layer pattern 37A using the second mask pattern 42 as an etch barrier, thereby forming the first conductive layer pattern 37B that surrounds pillar patterns individually. Also, the first insulation layer 41 is prevented from etching by increasing the etch selectivity of the first conductive layer pattern 37A and the first insulation layer 41 when the first conductive layer pattern 37A is etched.

Then, the second mask layer pattern 42 is removed.

Figure 8A:
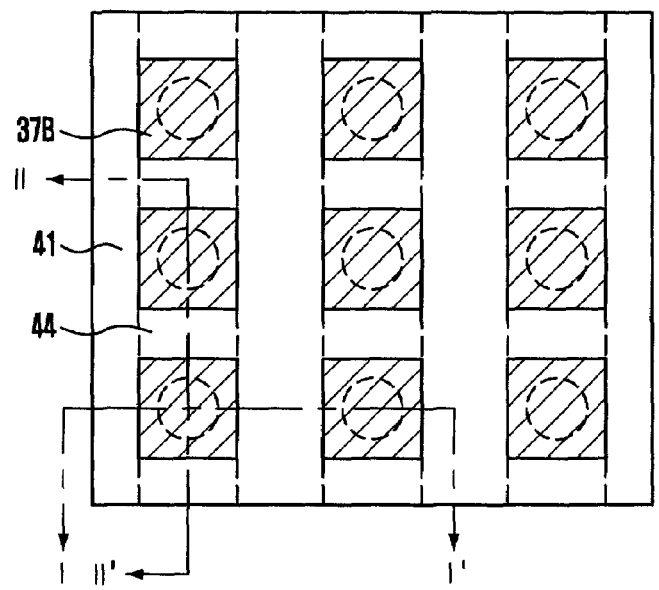
Figure 8B:
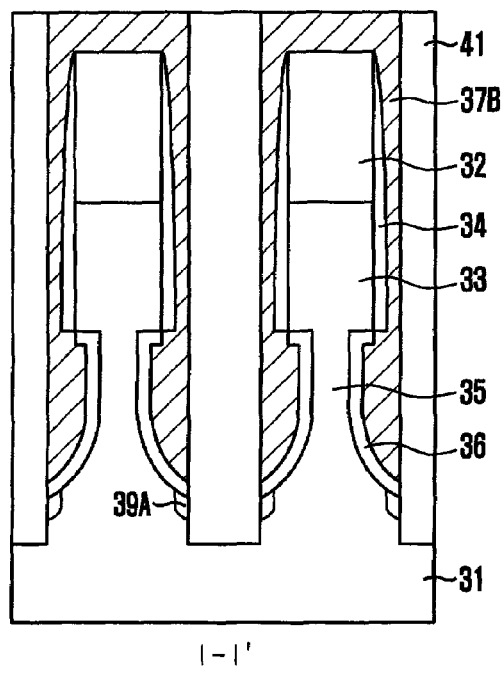
Figure 8C:
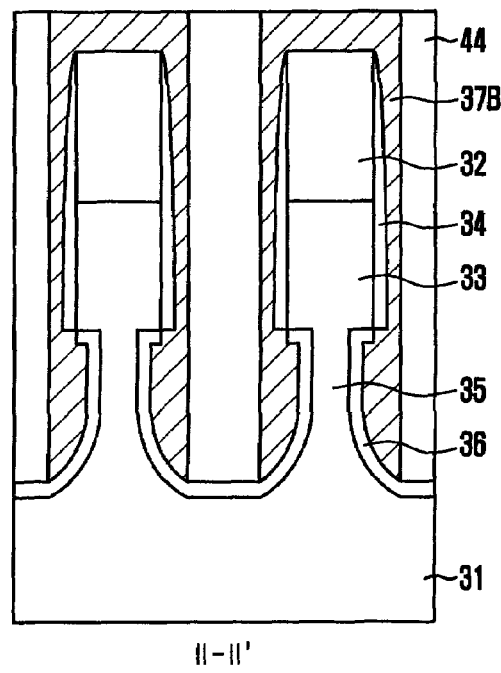

FIG. 8A is a plan view, FIG. 8B is a cross-sectional view of FIG. 8A taken along the line I-I', and FIG. 8C is a cross-sectional view of FIG. 8A taken along the line II-II'. As shown in FIGS. 8A to 8C, the second trench 43 is filled with the second insulation layer 44. A surface of the first insulation layer 41 has a height identical to that of a surface of the second insulation layer 44. Therefore, a surface of the substrate 31 having the second insulation layer 44 is flat.

The individual first conductive layer patterns 37B are isolated by forming the second insulation layer 44.

Figure 9A:
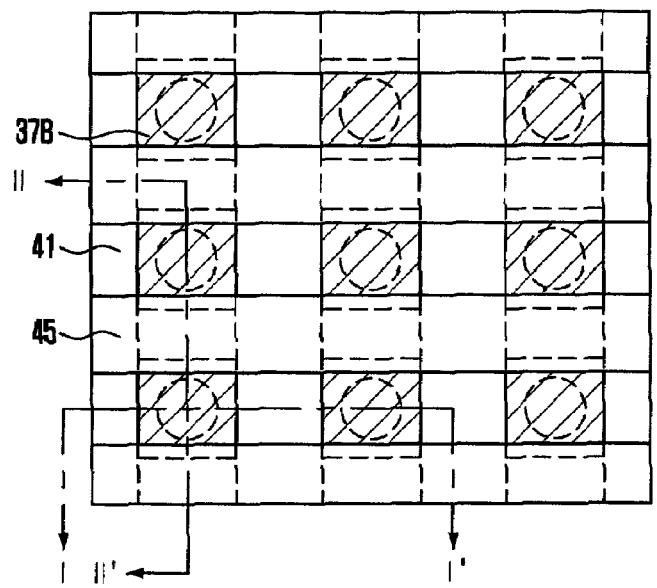
Figure 9B:
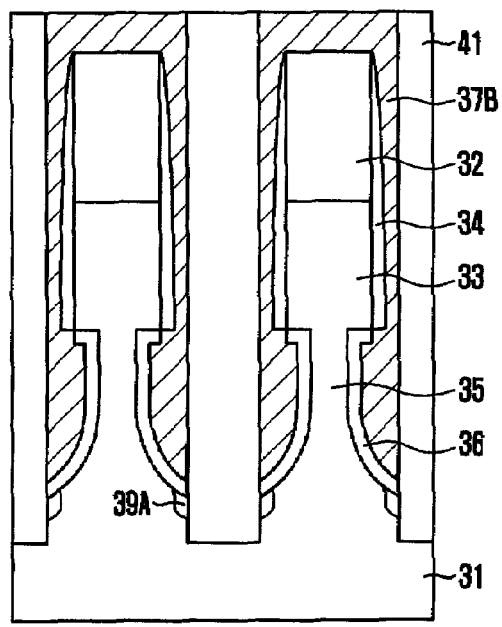
Figure 9C:
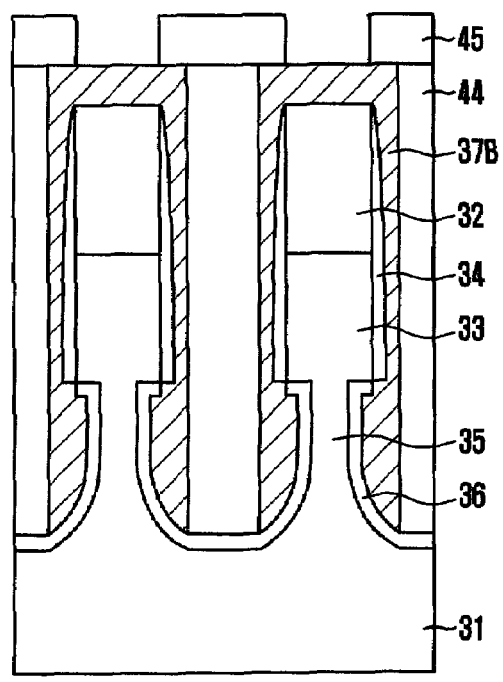

FIG. 9A is a plan view, FIG. 9B is a cross-sectional view of FIG. 9A taken along the line I-I', and FIG. 9C is a cross-sectional view of FIG. 9A taken along the line II-II'. As shown in FIGS. 9A to 9C, a third mask layer pattern 45 is formed to cover the second insulation layer 44 and extends in parallel with the removed second mask layer pattern (see 42 of FIG. 3E).

The third mask layer pattern 45 has a shape that opens a region for forming a following word line.

Figure 10A:
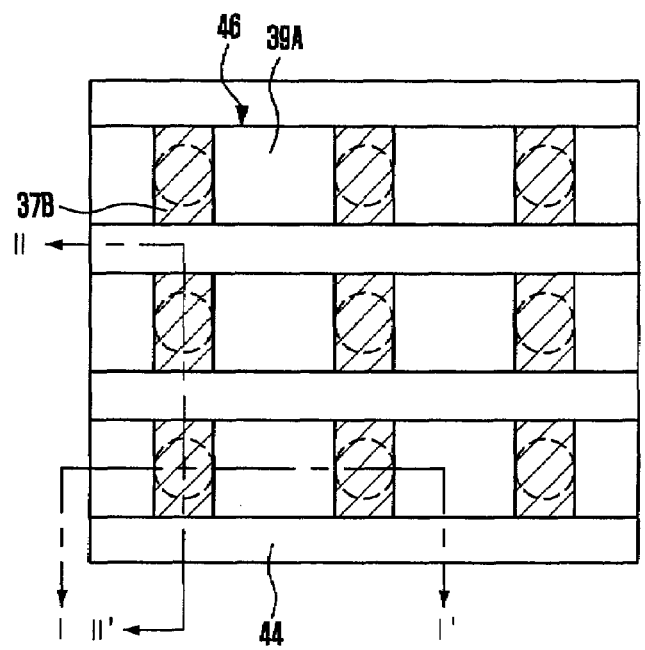
Figure 10B:
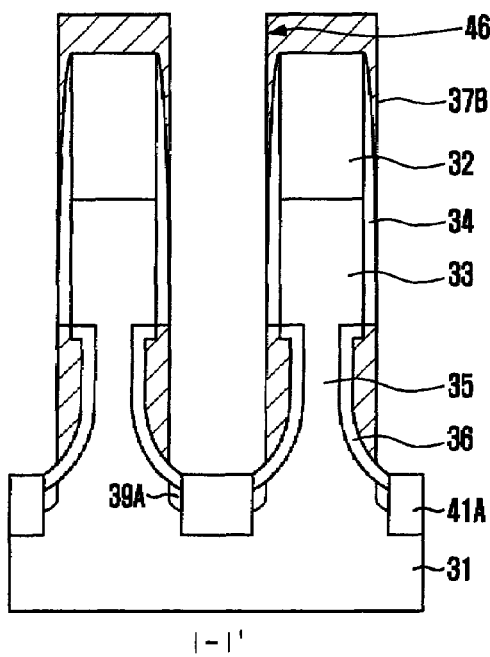
Figure 10C:
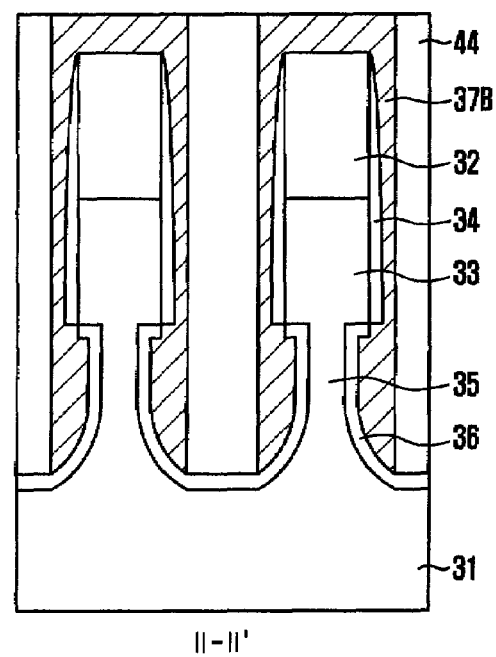

FIG. 10A is a plan view, FIG. 10B is a cross-sectional view of FIG. 10A taken along the line I-I", and FIG. 10C is a cross-sectional view of FIG. 6A taken along the line II-II'. As shown in FIGS. 10A to 10C, a plurality of third trenches 46 are formed by etching predetermined parts of the first insulation layer 41 using the third mask layer pattern 45 as an etch barrier.

After etching, the remaining first insulation pattern 41A has a thickness that can insulate and isolate one of the buried bit lines 39A from the other. Also, one sidewall of the sidewall passivation layers 34 facing each other is exposed by forming the third trench 46.

Figure 11A:
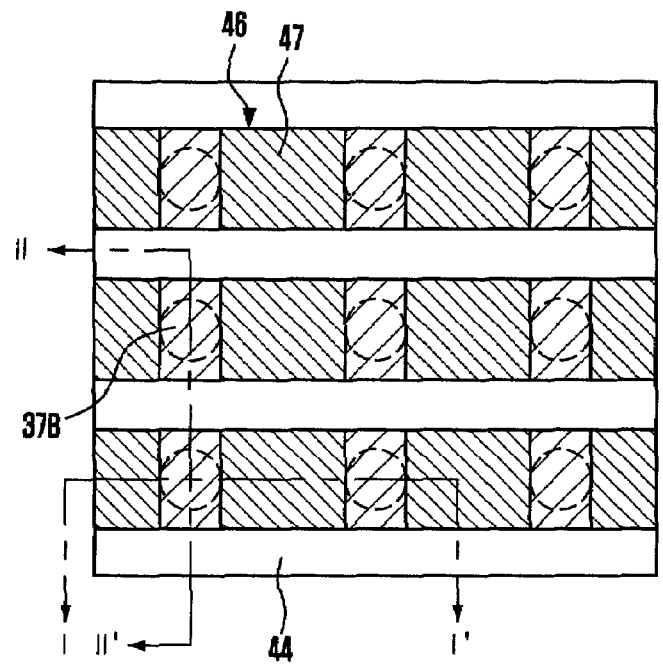
Figure 11B:
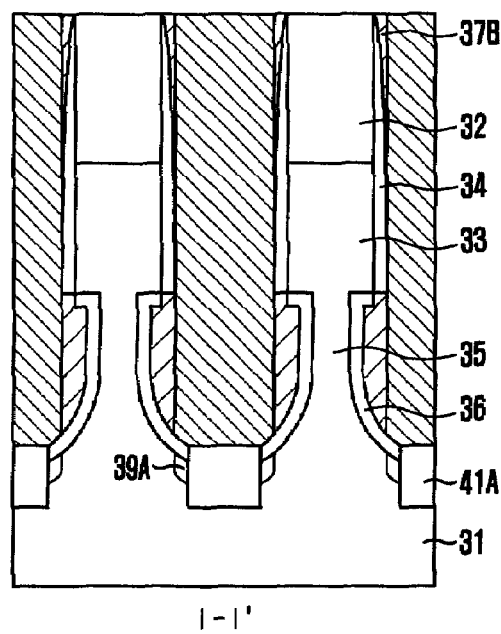

FIG. 11A is a plan view, and FIG. 11B is a cross-sectional view of FIG. 11A taken along the line I-I'. As shown in FIGS. 11A and 11B, the third trench 46 is filled with the second conductive layer 47. Here, since the third trench 46 exposes one sidewall of the adjacent first conductive layer patterns 37B that faces the other, and since the third trench 46 is filled with the second conductive layer 47, the adjacent first conductive layer patterns 37B are electrically connected by the second conductive layer 47.

Figure 12A:
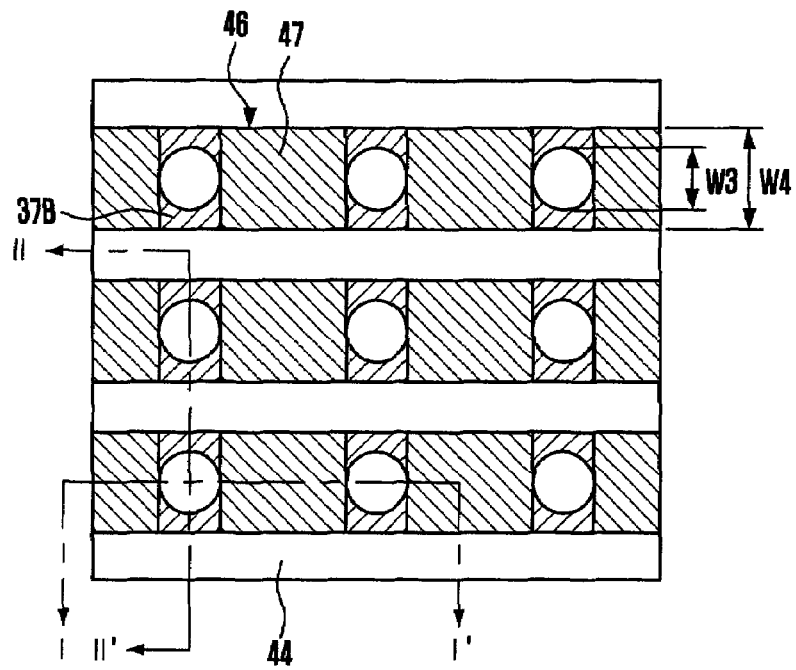
Figure 12B:
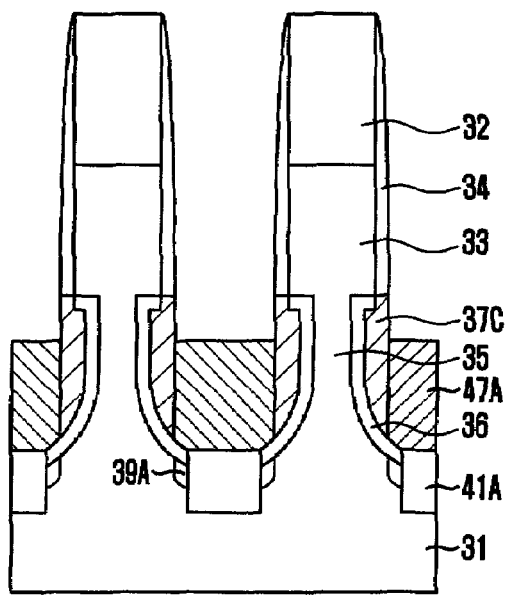

FIG. 12A is a plan view, and FIG. 11B is a cross-sectional view of FIG. 12A taken along the line I-I'. As shown in FIGS. 12A and 12B, a word line 47A is formed by patterning the second conductive layer 47. The word line 47A is formed by performing an etch-back process using the second conductive layer 47. Here, a part of the first conductive layer pattern 37B is etched together. The etched first conductive layer pattern 37B operates as a gate electrode, thereby inducing a vertical channel.

As shown in FIG. 12A, source and drain regions are formed at the gate electrode 37B, the pillar head 33, and the buried bit line 39A in order to induce a channel in a vertical direction. Also, the word line 48B and the buried bit line 39A are formed. Here, the word line 48B transfers a driving voltage to the gate electrode 37B, and the buried bit line 39A shares data of a cell through the gate electrode 37B. The cell denotes a capacitor that is connected to the pillar head 33.

Figure 1A:
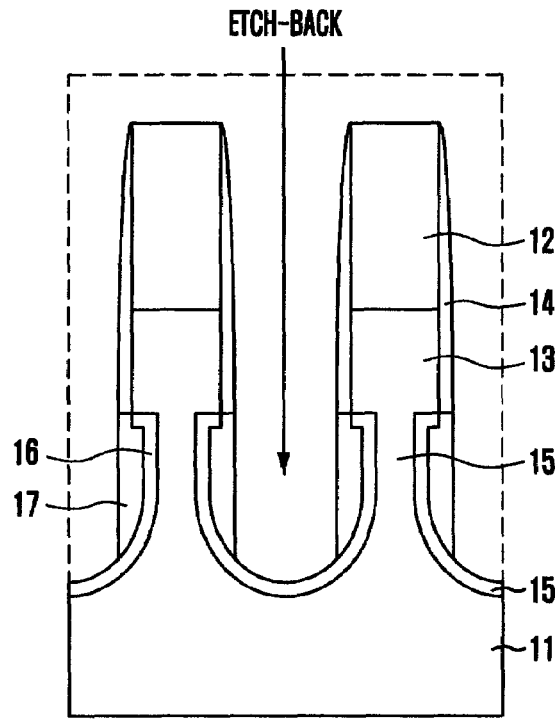
FIGS. 1A to 1C are cross-sectional views of a semiconductor device depicting a method of fabricating a semiconductor device having a channel formed in a vertical direction according to the related art.
Figure 1B:
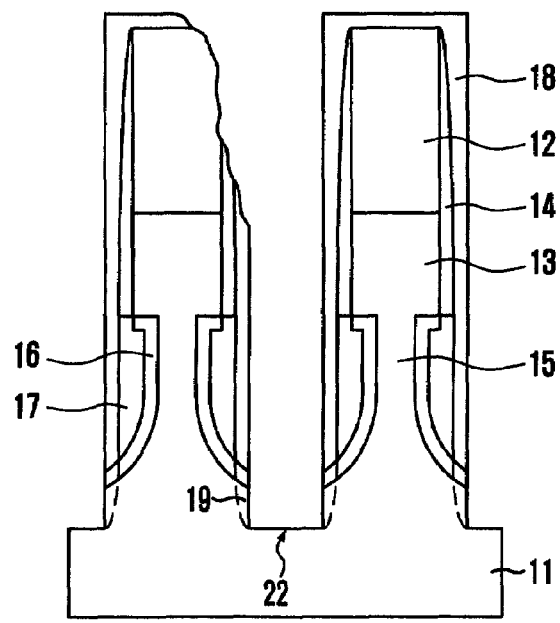
Figure 1C:
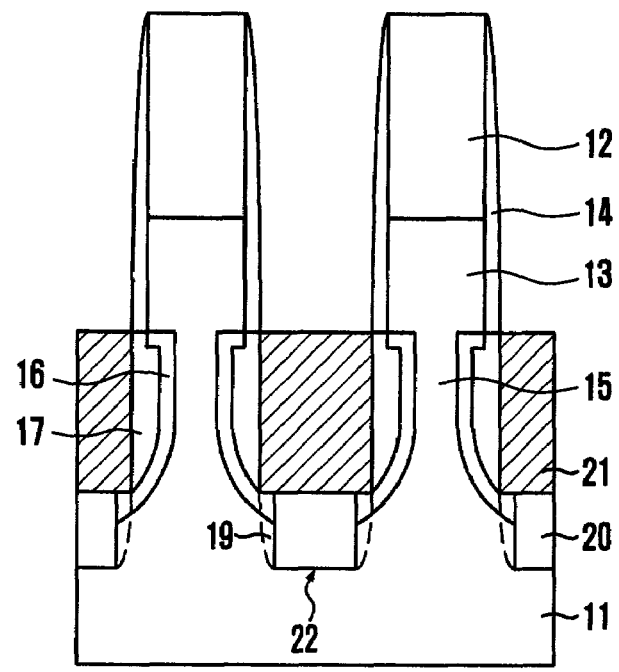
Figure 2:
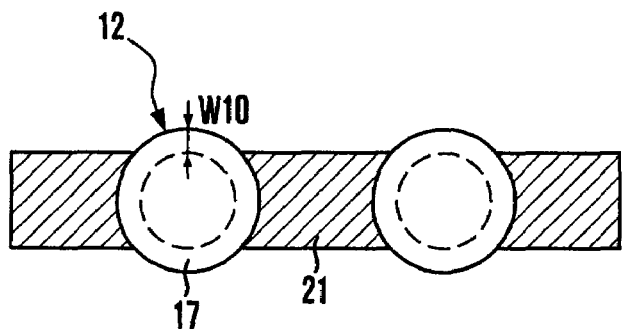
FIG. 2 is a plan view of FIG. 1C.

A width W4 of the gate electrode 37B is wider than a width W3 of the pillar head 33. Accordingly, the width of the pillar head 33 is wider than the width W10 of the gate electrode 17 according to the related art shown in FIG. 2 under the same condition. It means that the resistance of the word line is reduced according to the increment of the width of the gate electrode 37B.

In the present embodiment, the gate electrode 37B is formed by performing the first pattern process using the first mask layer pattern 38 and performing the second patterning process using the second mask pattern 42 after forming the insulation layer that covers the gate hard mask layer pattern 32. Therefore, it is possible to omit the etch-back process of the gate electrode. Also, it is possible to prevent the gate hard mask layer pattern 32 from becoming loose while etching, by leaving the first mask layer pattern 38 or the second mask layer pattern 42 on the gate hard mask layer pattern 32. Therefore, the loss of the gate hard mask layer pattern 32 by the etch back process can be prevented, and the pillar pattern is prevented from bending.

Moreover, it is possible to prevent the pillar pattern from being exposed while isolating the impurity region in forming the first conductive layer 37 as a metal layer. That is, since the substrate and the metal layer having a high etch selectivity protect the sidewall of the pillar pattern while etching the substrate, the pillar pattern is not exposed.

Embodiments of the present application relate to a method of fabricating a semiconductor device having a channel formed in a vertical direction. In accordance with the embodiments of the present application, the gate electrode is formed using mask patterns covering the pillar pattern instead of performing an etch-back process. Therefore, the pillar pattern prevents any damaging and bending while forming the gate electrode.

The reliability of the semiconductor device is improved through reducing the resistance of the word lines.

Finally, it is possible to secure the stability of the semiconductor device having the channel formed in the vertical direction, and to improve a yield thereof.

While the present application has been described with respect to the specific embodiments, it will be apparent to those skilled in the art that various changes and modifications may be made without departing from the spirit and scope as defined in the following claims.

What is claimed is:

1. A method of fabricating a semiconductor device, comprising:
   forming a plurality of pillar patterns on a substrate;
   filling a gap between the pillar patterns with a first conductive layer;
   forming a first hard mask layer pattern over the pillar patterns adjacent in a first direction, wherein the first hard mask extends in the first direction as a line type mask pattern for forming a bit line;
   forming a trench by etching the first conductive layer using the first hard mask layer pattern as an etch barrier;
   removing the first mask layer pattern;
   filling the trench with an insulation layer;
   forming a second hard mask pattern over the pillar pattern adjacent in a second direction that crosses the first direction, the second mask layer pattern extending in the second direction and crossing the removed first mask layer pattern; and
   forming a gate electrode surrounding the pillar patterns by etching the remaining first conductive layer using the second hard mask layer pattern as an etch barrier.

2. The method of claim 1, further comprising:
   forming an impurity region in the substrate under the pillar patterns after forming the pillar patterns.

3. The method of claim 2, further comprising:
   isolating the impurity region by etching the substrate using the first hard mask layer pattern and the first conductive layer as an etch barrier after etching the first conductive layer using the first hard mask layer pattern.

4. The method of claim 3, wherein the first conductive layer covers sidewalls of the pillar pattern when the substrate is etched.

5. The method of claim 1, further comprising:
   forming a word line connecting the gate electrodes adjacent in one direction after forming the gate electrodes.

6. The method of claim 1, wherein the first conductive layer is formed of a poly silicon layer or a metal layer.

7. The method of claim 1, wherein the first hard mask layer pattern is formed to have a width which is wider than the pillar patterns.

8. A method of fabricating a semiconductor device comprising:
   forming a plurality of pillar patterns on a substrate;
   forming an impurity region by doping impurity into the substrate at a base of the pillar pattern;
   forming a gate insulation layer so as to surround a pillar neck of each of the pillars;
   forming a first conductive layer over the gate insulation layer;
   forming a first mask layer pattern over the first conductive layer so that the width of the first mask layer pattern is wider than a width of the pillar pattern including a sidewall passivation layer and so that the first mask pattern extends in one direction as a line type mask pattern for forming a buried bit line by dividing the impurity region by about half;

forming a first trench by etching the first conductive layer, the gate insulation layer, and a portion of the impurity region using the first mask layer pattern as an etch barrier;

removing the first mask layer pattern;

filling the first trench with a first insulation layer;

forming a second mask layer pattern over the first insulation layer so that the second mask layer pattern extends in a direction crossing the removed first mask layer pattern; and forming a second trench by etching the first conductive layer pattern using the second mask pattern as an etch barrier, thereby forming a first conductive layer pattern that surrounds pillar patterns individually.

9. The method of claim 8, further comprising:

removing the second mask layer pattern;

filling the second trench with a second insulation layer so that a surface of the second insulation layer has a height essentially the same as a surface of the first insulation layer; and forming a third mask layer pattern so as to cover the second insulation layer, so that it extends in parallel with the removed second mask layer pattern, and so that the third mask layer pattern has a shape which opens a region for forming a following word line.

10. The method of claim 9, further comprising forming a third mask layer pattern to cover the second insulation layer and extends in parallel with the removed second mask layer pattern, the third mask layer pattern 45 having a shape that opens a region for forming a following word line.

11. The method of claim 10, further comprising forming a plurality of third trenches by etching predetermined parts of the first insulation layer using the third mask layer pattern as an etch barrier and so that after etching, the remaining first insulation pattern having a thickness selected to insulate and isolate one of the buried bit lines from the other.

12. The method of claim 11, further comprising filling the third trenches with the second conductive layer so that each third trench exposes one sidewall of the adjacent first conductive layer patterns that faces the other, and each third trench is filled with the second conductive layer, whereby the adjacent first conductive layer patterns are electrically connected by the second conductive layer.

13. The method of claim 12, further comprising forming a word line by patterning the second conductive layer and performing an etch-back process using the second conductive layer and in a manner wherein a part of the first conductive layer pattern is etched together, and so that the etched first conductive layer pattern operates as a gate electrode.

14. The method of claim 8, wherein the impurity region is formed so as to form a source and drain as well as a buried bit line.

15. The method of claim 8 wherein the first conductive layer comprises poly silicon layer or a metal layer.

* * * * *